(12) United States Patent
Zhang et al.

(10) Patent No.: US 9,953,970 B2
(45) Date of Patent: Apr. 24, 2018

(54) SEMICONDUCTOR DEVICE HAVING ESD PROTECTION STRUCTURE

(71) Applicant: CSMC TECHNOLOGIES FAB1 CO., LTD., Wuxi New District (CN)

(72) Inventors: Guangsheng Zhang, Wuxi New District (CN); Sen Zhang, Wuxi New District (CN)

(73) Assignee: CSMC TECHNOLOGIES FAB1 CO., LTD., Wuxi New District, Jiangsu (CN)

( * ) Notice: Subject to any disclaimer, the term of this patent is extended or adjusted under 35 U.S.C. 154(b) by 90 days.

(21) Appl. No.: 15/308,574

(22) PCT Filed: May 4, 2015

(86) PCT No.: PCT/CN2015/078222
§ 371 (c)(1),
(2) Date: Nov. 2, 2016

(87) PCT Pub. No.: WO2015/169197
PCT Pub. Date: Nov. 12, 2015

(65) Prior Publication Data
US 2017/0062405 A1    Mar. 2, 2017

(30) Foreign Application Priority Data
May 4, 2014 (CN) .......................... 2014 1 0184376

(51) Int. Cl.
*H01L 27/02* (2006.01)
*H01L 23/60* (2006.01)
(Continued)

(52) U.S. Cl.
CPC .......... *H01L 27/027* (2013.01); *H01L 23/535* (2013.01); *H01L 23/60* (2013.01); *H01L 29/7393* (2013.01); *H01L 2924/0002* (2013.01)

(58) Field of Classification Search
CPC ..... H01L 27/027; H01L 23/535; H01L 23/60; H01L 29/7393
See application file for complete search history.

(56) References Cited

U.S. PATENT DOCUMENTS 5,578,860 A * 11/1996 Costa .................. H01L 27/0251
257/362
5,654,574 A * 8/1997 Williams ............... H02H 9/042
257/173
(Continued)

FOREIGN PATENT DOCUMENTS

CN            1755930 A       4/2006
CN         100444378 C       12/2008
(Continued)

OTHER PUBLICATIONS

English Translation of International Search Report for International Application No. PCT/CN2015/078222, dated Aug. 7, 2015.
(Continued)

*Primary Examiner* — Ida M Soward
(74) *Attorney, Agent, or Firm* — Kagan Binder, PLLC

(57) ABSTRACT

The present disclosure relates to a semiconductor device with an ESD protection structure. The semiconductor device includes a high-voltage power device 101, the ESD protection structure is a NMOS transistor 102, a drain of the NMOS transistor is shared by a source of the power device as a common-drain-source structure 107, substrate leading-out regions of the power device 101 and the NMOS transistor are coupled to the source 106 of the NMOS transistor as a ground leading-out. In the present disclosure, the drain of the NMOS transistor is shared by the source of the power device, so the increased area of the device with the ESD protection structure incorporated is small. In addition, the holding voltage at the source of the high-voltage power
(Continued)

device is relatively low, which helps to protect the gate oxide and improve the source reliability.

6 Claims, 2 Drawing Sheets

(51) Int. Cl.
  *H01L 29/73* (2006.01)
  *H01L 23/535* (2006.01)
  *H01L 29/739* (2006.01)

(56) References Cited

U.S. PATENT DOCUMENTS

| | | | | |
|---|---|---|---|---|
| 5,672,527 | A * | 9/1997 | Lee | H01L 27/0266 257/356 |
| 5,684,321 | A * | 11/1997 | Okamura | H01L 27/0251 257/355 |
| 5,751,042 | A * | 5/1998 | Yu | H01L 27/0251 257/360 |
| 5,903,032 | A * | 5/1999 | Duvvury | H01L 27/0259 257/355 |
| 6,281,553 | B1 * | 8/2001 | Sasaki | H01L 27/0288 257/356 |
| 6,998,685 | B2 | 2/2006 | Manna et al. | |
| 7,929,262 | B1 | 4/2011 | Vashchenko et al. | |
| 7,968,936 | B2 * | 6/2011 | Denison | H01L 27/0262 257/170 |
| 9,105,715 | B2 * | 8/2015 | Miura | H01L 29/0638 |
| 9,136,373 | B2 * | 9/2015 | Chan | H01L 29/7816 |
| 2005/0017688 | A1 * | 1/2005 | Stellberger | H02J 7/0031 320/134 |
| 2006/0186467 | A1 * | 8/2006 | Pendharkar | H01L 27/088 257/337 |
| 2009/0267147 | A1 * | 10/2009 | De Boet | H01L 27/0266 257/337 |
| 2010/0123985 | A1 * | 5/2010 | Wang | H02H 9/046 361/56 |
| 2012/0181611 | A1 * | 7/2012 | Akai | H01L 27/0285 257/358 |
| 2012/0275072 | A1 * | 11/2012 | Chen | H01L 27/0262 361/56 |
| 2013/0229736 | A1 | 9/2013 | Van Der Borght et al. | |
| 2014/0092508 | A1 * | 4/2014 | Ko | H02H 9/046 361/56 |

FOREIGN PATENT DOCUMENTS

| | | |
|---|---|---|
| CN | 102290340 A | 12/2011 |
| CN | 102623452 A | 8/2012 |

OTHER PUBLICATIONS

Deng et al., U.S. Appl. No. 14/902,516, International Application Filing Date Jul. 29, 2014.
Zhong et al., U.S. Appl. No. 14/902,517, International Application Filing Date Jul. 22, 2014.
Zhang et al., U.S. Appl. No. 14/902,519, International Application Filing Date Aug. 19, 2014.
Wang et al., U.S. Appl. No. 14/902,302, International Application Filing Date Sep. 2, 2014.
Zhang et al., U.S. Appl. No. 15/023,049, International Application Filing Date Dec. 2, 2014.
Jing et al., U.S. Appl. No. 15/023,057, International Application Filing Date Dec. 4, 2014.
Hu et al., U.S. Appl. No. 15/119,249, International Application Filing Date May 8, 2015.
Wang et al., U.S. Appl. No. 15/119,289, International Application Filing Date Apr. 29, 2015.
Qian et al., U.S. Appl. No. 15/119,311, International Application Filing Date May 6, 2015.
First Office Action (and English Translation thereof) and related Search Report for Chinese Application No. 201410184376.2, dated Jun. 20, 2017 (10 pages).

* cited by examiner

SEMICONDUCTOR DEVICE HAVING ESD PROTECTION STRUCTURE

FIELD

The present disclosure relates to a semiconductor device, and more particularly relates to a semiconductor device with an ESD protection structure.

BACKGROUND

Electrostatic discharge (ESD) is one of the important reliability issues of modern integrated circuits (ICs). FIG. 1 illuminates an ESD curve of a source of a traditional high-voltage device, in which the voltage is unable to hold, thus it is possible to have a significant impact on the gate of the device.

The ESD protection of a conventional high-voltage device is generally achieved by the self protection function of the device, thus the ESD protection relates closely to the capacity of the device itself. The ESD protection of the source of the high-voltage device is generally achieved by adding a protection structure to the source of the high-voltage device, but the protection structure will take up a large area of the device.

SUMMARY

Based on the above, t it is necessary to provide a semiconductor device with an ESD protection structure, which requires a small overall area.

A semiconductor device with an ESD protection structure includes a power device, wherein the ESD protection structure is a NMOS transistor, a drain of the NMOS transistor is shared by a source of the power device, substrate leading-out regions of the power device and the NMOS transistor are coupled to the source as a ground leading-out.

In the above semiconductor device with the ESD protection structure, the drain of the NMOS transistor is shared by the source of the power device, so the increased area of the device by adding the ESD protection structure is small.

BRIEF DESCRIPTION OF THE DRAWINGS

To better illustrate embodiments of the present disclosure or technical solutions in the art, the figures used in the embodiments will be briefly described. Obviously, these figures illustrate only some embodiments of the present disclosure, and the skilled in the art would be capable of obtaining figures of the other embodiments based on the one disclosed herein without inventiveness work.

DETAILED DESCRIPTION OF THE EMBODIMENTS

To better understand the objects, features and advantages of the present disclosure, the detailed embodiments will be illustrated with reference to the accompany drawings.

Figure 1:
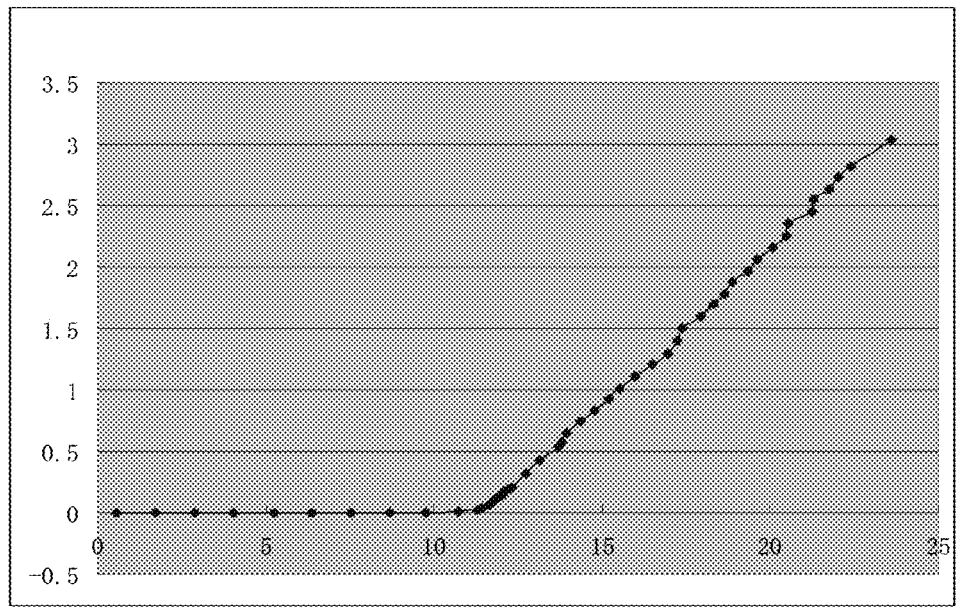
FIG. 1 is a chart illustrating an ESD curve of a source of a traditional high-voltage device.
Figure 2:
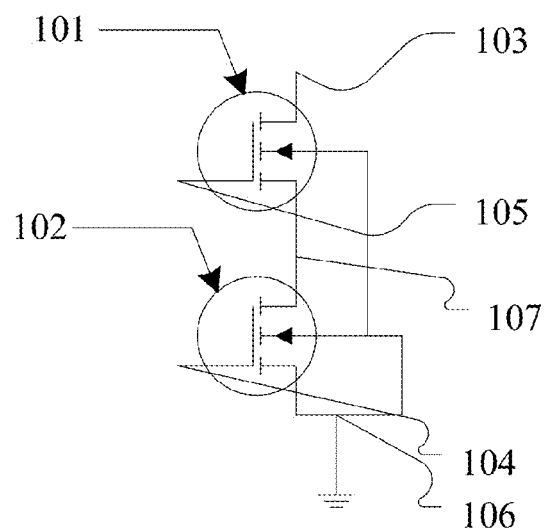
FIG. 2 is a diagram illustrating an equivalent circuit of a semiconductor device with an ESD protection structure in accordance with one embodiment.

FIG. 2 is a diagram illustrating an equivalent circuit of a semiconductor device with an ESD protection structure in accordance with one embodiment, including a high-voltage power device 101 and a NMOS transistor 102 as an ESD protection structure. The drain of the power device 101 can withstand a high voltage from dozens of volts to hundreds of volts (the voltage endurance capability depends on design requirements of the device). The gate 105 of the power device is used as a control terminal to control the "on" or "off" of the power device 101. The gate 104 of the NMOS transistor 102 controls the "on" or "off" of the NMOS transistor 102. The drain of the NMOS transistor 102 is shared by the source of the power device 101 as a common-drain-source structure 107, that is, such structure in the device is used both as the drain of the NMOS transistor 102 and the source of the power device 101. The substrate leading-out region of the power device 101, the substrate leading-out region of the NMOS transistor, and the source 106 of the NMOS transistor coupled together as a ground leading-out.

The drain of the NMOS transistor is shared by the source of the power device, so the increased area of the device by adding the ESD protection structure is small.

During the use of the above semiconductor device with the ESD protection structure, the gate 104 may be shorted to the source 106 (and grounded) to form a GGMOS, so as to ensure that a current path may be formed between the common-drain-source structure 107 and the ground when the device undergoes high voltage surge and electrostatic discharge. Alternatively, an peripheral circuit may also be used to control the "on" or "off" of the NMOS transistor 102 through the gate 104, to ensure a current path between the common-drain-source structure 107 and the ground. In this way, the source voltage can be held at a low value, to protect the gate of the device from broken-down, thus ensuring the reliability of the source of the power device 101.

Figure 3:
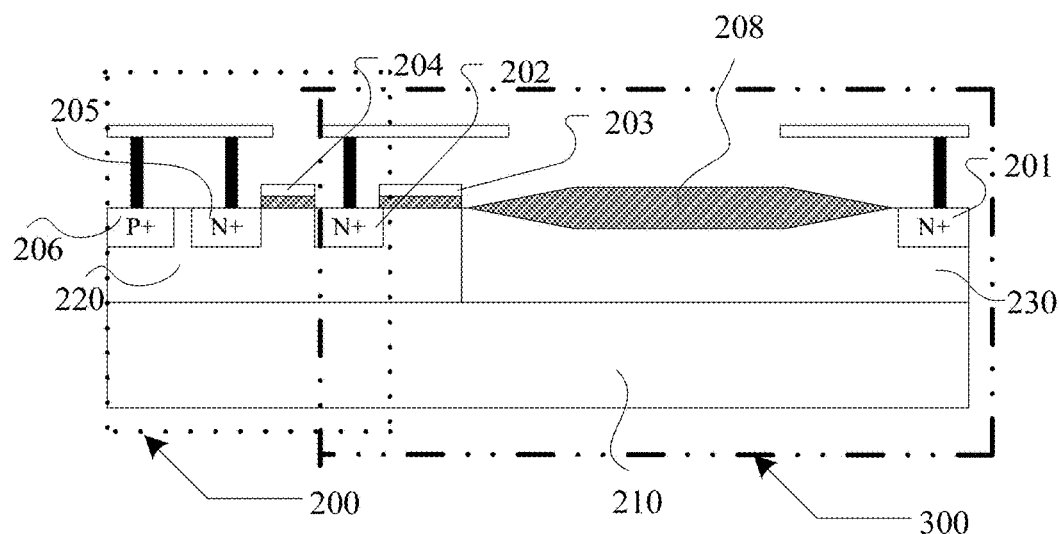
FIG. 3 is a diagram illustrating a cross section of a semiconductor device with an ESD protection structure in accordance with one embodiment.

FIG. 3 is a diagram illustrating a cross section of a semiconductor device with an ESD protection structure in accordance with one embodiment, in which a NMOS transistor region 200 and a power device region 300 are presented with a wireframe respectively. Specifically, the device includes: first type doping substrate 210, a first type doping well region 200 on the substrate 210, a second type doping drift region 230 on the substrate 210, a substrate leading-out region 206 and two second type doping leading-out regions (i.e., a leading-out region 202 and a leading-out region 205) within the well region 200, a drain 201 within the drift region 230, a first gate 204 and a second gate 203 on the well region 220, and an oxide layer 208 on the surface of the drift region 230 for separating the second gate 203 and the drain 201.

The drain 201 within the drift region 230 is a drain of the power device. The leading-out region 205 is used as a source leading-out region of the NMOS transistor, which is close to the substrate leading-out region 206, and coupled to the substrate leading-out region 206 via a metal wire, as the ground leading-out. The leading-out region 202 is close to the oxide layer 208, and used as the drain of the NMOS transistor to be shared by the source of the power device, with a manufacturing method of bonding the leading-out region 202 and the source together. The first gate 204 is arranged between the leading-out region 202 and the leading-out region 205, as a gate of the NMOS transistor. The second gate 203 is arranged between the leading-out region 202 and the oxide layer 208, as a gate of the power device. The first type has a conduction type opposite to that of the second type.

In this embodiment, the first type is P type, the second type is N type, the drain of the power device is N+ type doping, and the substrate leading-out region is P+ type doping.

The second gate 203 is primarily used to control the switching characteristic of the high-voltage power device. The first gate 204 may either operates as an independent terminal to control the switching characteristic of the low voltage NMOS transistor together with an peripheral control circuit, or be shorted to the leading-out region 205 to form a GGMOS to provide a current path for the high-voltage power device and to obtain a low holding voltage at the source, helping to protect the gate oxide and improve the reliability.

Figure 4:
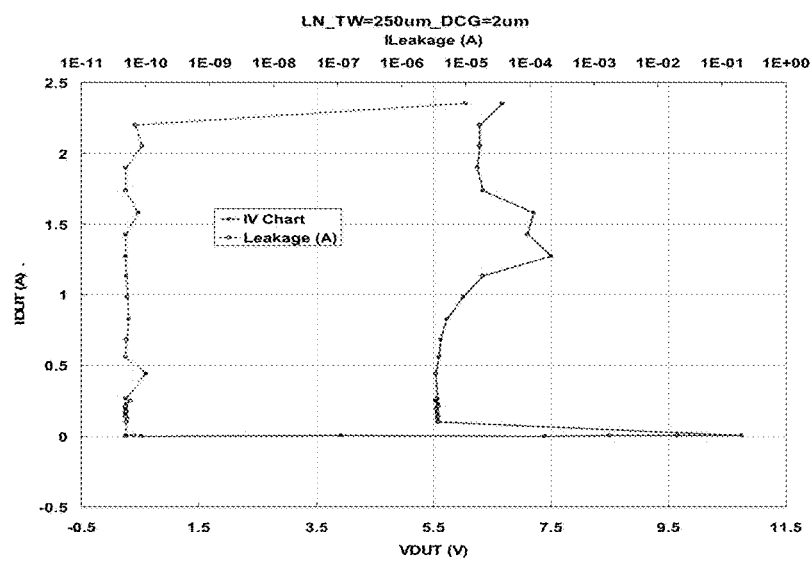
FIG. 4 is a chart illustrating a relation curve of the source voltage and the source current, and a relation curve of the source current and the leak current, of the above semiconductor device with the ESD protection structure.

FIG. 4 is a chart illustrating a relation curve of the source voltage and the source current, and a relation curve of the source current and the leak current, of the above semiconductor device with the ESD protection structure, in which the curve beginning at the origin and extending to the right is the relation curve of the source voltage and the source current, and the curve beginning at the origin and extending upward is the relation curve of the source current and the leak current.

Although the present disclosure has been described with reference to the embodiments thereof and the best modes for carrying out the present invention, it is apparent to those skilled in the art that a variety of modifications and changes may be made without departing from the scope of the present disclosure, which is intended to be defined by the appended claims.

What is claimed is:

1. A semiconductor device with an ESD protection structure, comprising a power device, wherein the ESD protection structure is a NMOS transistor, a drain of the NMOS transistor is shared by a source of the power device, substrate leading-out regions of the power device and the NMOS transistor are coupled to the source as a ground leading-out.

2. The semiconductor device with the ESD protection structure of claim 1, wherein a gate of the NMOS transistor is shorted to the ground leading-out.

3. The semiconductor device with the ESD protection structure of claim 1, wherein a gate of the NMOS transistor is controlled by a signal from a peripheral control circuit to switch between a turning-on or turning-off state.

4. The semiconductor device with the ESD protection structure of claim 1, further comprising a first type doping substrate, a first type doping well region and a second type doping drift region on the substrate, a substrate leading-out region and two second type doping leading-out regions within the well region, a drain within the drift region, a first gate and a second gate on the well region, and an oxide layer for separating the second gate and the drain, wherein: the drain within the drift region is a drain of the power device; one of the two second type doping leading-out regions is used as a source leading-out region of the NMOS transistor close to the substrate leading-out region, coupled to the substrate leading-out region via a metal wire as the ground leading-out; the other of the two second type doping leading-out regions is close to the oxide layer, and used as the drain of the NMOS transistor to be shared by the source of the power device; the first gate is arranged between the two second type doping leading-out regions, as a gate of the NMOS transistor, and the second gate is arranged between the source of the power device and the oxide layer, as a gate of the power device; and the first type has a conduction type opposite to that of the second type.

5. The semiconductor device with the ESD protection structure of claim 4, wherein the first type doping is P type doping, the second type doping is N type doping, the drain of the power device is N+ type doping, and the substrate leading-out region is P+ type doping.

6. The semiconductor device with the ESD protection structure of claim 4, wherein the oxide layer is arranged on a surface of the drift region.

* * * * *